(12) United States Patent
Orita et al.

(10) Patent No.: US 6,630,740 B1
(45) Date of Patent: Oct. 7, 2003

(54) SEMICONDUCTOR DEVICE

(75) Inventors: Kunihiko Orita, Fukuyama (JP); Nobuyoshi Awaya, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 264 days.

(21) Appl. No.: 09/671,737

(22) Filed: Sep. 29, 2000

(30) Foreign Application Priority Data

Feb. 16, 2000 (JP) ........................................ 2000-037902

(51) Int. Cl.$^7$ ................................................ H01L 29/40
(52) U.S. Cl. ........................................ 257/762; 257/741
(58) Field of Search ........................ 257/762, 741, 257/701, 759

(56) References Cited

U.S. PATENT DOCUMENTS 6,228,758 B1 * 5/2001 Pellerin et al. ............. 438/624

FOREIGN PATENT DOCUMENTS

| EP | 0 935 283 A2 | 8/1999 |
| JP | 11-162983 | 6/1999 |

OTHER PUBLICATIONS

VLSI Manufacturing Technique, 1997, pg. 203.
H. Miyazaki et al.: "Phosphosilicate Glass Passivation for ULSI Cu Metallization" Central Research Laboratory Hitachi, Ltd., Tokyo Japan K. Murakami, Hitchi VLSI Engineering Co., Ltd. J. Electrochem. Soc., vol. 139, No. 11, Nov. 1992.

* cited by examiner

*Primary Examiner*—Roy Potter
(74) *Attorney, Agent, or Firm*—Nixon & Vanderhye P.C.

(57) ABSTRACT

An interlayer insulating film having a connection hole and a line insulating film having a wiring groove are formed on a semiconductor substrate. The interlayer insulating film and the line insulating film are made principally of $SiO_2$, and contain phosphorus and hydrocarbon. A copper wiring film that covers the connection hole and the wiring groove of the interlayer insulating film and the line insulating film is formed. Therefore, this semiconductor device is able to prevent the diffusion of copper into a low dielectric constant insulating film constructed of the interlayer insulating film and the line insulating film, reduce the dielectric constant and water absorptively of the low dielectric constant insulating film and reduce the cross-talk noises.

16 Claims, 4 Drawing Sheets

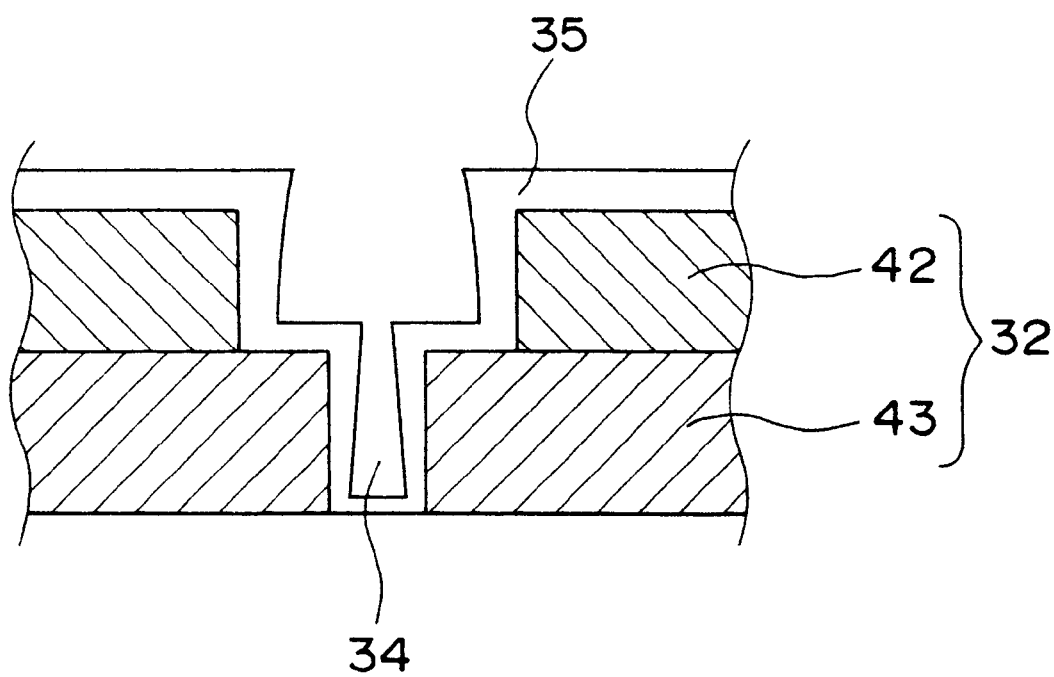

SEMICONDUCTOR DEVICE

BACKGROUND OF THE INVENTION

The present invention relates to a semiconductor device and a method for fabricating the device, and in particular, to a semiconductor device that has a wiring layer constructed principally of copper and a low dielectric constant insulating film and a method for fabricating the device.

In recent years, as the semiconductor devices are made finer and denser in terms of integration, the wiring is provided in a plurality of layers and concurrently the wiring width and wiring interval become reduced. For the above reasons, wiring delay occurs to reduce the operating speed of the semiconductor device due to (1) an increase in wiring resistance and (2) an increase in wiring capacitance (line capacitance and interlayer capacitance).

Accordingly, there is a growing demand for reducing the wiring resistance and the wiring capacitance. In order to prevent the occurrence of the wiring delay of a semiconductor device, there are the following proposals (1) and (2).

(1) In order to reduce the wiring resistance, the wiring material is changed from an aluminum-based material (resistivity of Al: 3 $\mu\Omega$cm) to a copper material or a material made principally of copper (resistivity of Cu: 1.8 $\mu\Omega$cm)

(2) In order to reduce the wiring capacitance, the silicon oxide film (dielectric constant k=4) is changed to a low dielectric constant insulating film (dielectric constant k<3).

However, according to the above kind of bilayer structure in which the copper wiring and the low dielectric constant insulating film are put in direct contact with each other, there is a concern about the diffusion of copper atoms of the copper wiring into the low dielectric constant insulating film. Accordingly, there has been a conventional semiconductor device fabricating method for forming a barrier film between copper and the low dielectric constant insulating film for the prevention of the diffusion of copper by the barrier film. The barrier film is provided by either a metal barrier film or an insulating barrier film, according to use. Examples of the metal barrier film include a pure tantalum film (Ta), a tantalum nitride film (TaN), a titanium nitride film (TiN) and a tungsten nitride film (WN). Such a metal barrier film is principally used on the side surfaces and the bottom surfaces of the copper wiring in order to prevent the diffusion of copper into the insulating film, improve the adhesion of copper and achieve conduction with lower layer wiring. Examples of the insulating barrier film include a silicon nitride (SiN) film and a silicon oxy-nitride (SiON) film, which function as a copper diffusion block, and PSG (Phospho Silicate Glass) film for preventing the diffusion by trapping the diffused copper. Such an insulating barrier film is principally used for the upper portion of the copper wiring.

FIGS. 2A through 2E are process charts showing the conventional semiconductor device fabricating method, where are shown a lower layer conductive portion 31, a low dielectric constant insulating film 32 made of, for example, SiOF and SiOC, wiring grooves 33, connection holes 34, a metal barrier film 35, a copper wiring film 36 and an insulating barrier film 37.

The conventional semiconductor device is fabricated as follows.

First, as shown in FIG. 2A, the low dielectric constant insulating film 32 is deposited to a thickness of 600 to 900 nm on a lower layer conductive portion 31, and thereafter, the wiring grooves 33 that become wiring portions are formed on the low dielectric constant insulating film 32. Next, as shown in FIG. 2B, the connection holes 34 are formed by etching in the desired positions of the wiring grooves 33. Then, as shown in FIG. 2C, the metal barrier film 35 is deposited to a thickness of 10 to 50 nm by the CVD (Chemical Vapor Deposition) method or the sputtering method so as to entirely cover the surfaces of the bottom portions and the side wall portions of the wiring grooves 33 and the connection holes 34. Then, as shown in FIG. 2D, the copper wiring film 36 is deposited by the CVD method or the plating method so as to entirely cover the wiring grooves 33 and the connection holes 34, which are the opening portions. Finally, as shown in FIG. 2E, the portions that belong to the metal barrier film 35 and the copper wiring film 36 and are located above the wiring grooves 33 and the connection holes 34 are removed by the CMP (Chemical-Mechanical Polishing) method to flatten the surfaces of the low dielectric constant insulating film 32, the metal barrier film 35 and the copper wiring film 36, and thereafter, the insulating barrier film 37 is deposited on the low dielectric constant insulating film 32.

In the semiconductor device having the dual damascene structure shown in FIG. 2E, the effective copper wiring resistance becomes high since the volume of the copper wiring film 36 occupying the wiring region is reduced unless the metal barrier film 35 is made thinner as the device is made finer. Therefore, if the effective copper wiring resistance is reduced by reducing the metal barrier film 35 to a thickness of, for example, about 5 nm, then the barrier property of the metal barrier film 35 with respect to Cu diffusion is lost, causing a problem that Cu diffuses into the low dielectric constant insulating film to disadvantageously increase the leak and the dielectric constant. In fact, if the dual damascene structure as shown in FIG. 3 is formed, then the metal barrier film 35 comes to have the smallest thickness of not greater than 5 nm on the side walls of the connection holes 34, according to which the barrier property of the metal barrier film 35 is most weakened.

On the basis of the aforementioned results, the low dielectric constant insulating film 32 itself constructed of a line insulating film 42 and an interlayer insulating film 43 is required to have a barrier property, and in particular, the interlayer insulating film 43 having the connection hole 34 necessitates a barrier property.

Accordingly, it can be considered to employ an $SiO_2$ film containing hydrocarbon, a PSG film or the like as the low dielectric constant insulating film 32. The $SiO_2$ film containing hydrocarbon has a low dielectric constant. However, the $SiO_2$ film containing hydrocarbon has the problem that the film has an insufficient barrier property with respect to the copper diffusion. The PSG film, which has a diffused copper trapping ability, becomes a diffusion barrier (mentioned in Journal of Electrochemical Society, 139, 11, p. 3264, 1992, H. Miyazaki, H. Kojima, A. Hiraiwa and Y. Homma). However, the PSG film has the drawback that it has a dielectric constant equivalent to that of $SiO_2$ and high water absorptively. Moisture absorbed by the abovementioned high water absorptivity promotes the increase in dielectric constant and copper ionization (corrosion). Taking the fact that the diffusion of Cu in the insulating film and, in particular, the diffusion of Cu during the application of a bias is performed in the form of copper ions into consideration, there is the drawback that the Cu trapping effect peculiar to the phosphorus glass is canceled.

In the case of MOSLSI (Metal Oxide Semiconductor Large Scale Integrated Circuit), an increase in operating speed and a reduction in power voltage are achieved concurrently as the semiconductor devices are made finer, and this leads to a reduction in margin with respect to noises. If the distance between adjacent wiring lines is reduced, then signals of the adjacent wiring lines propagate as noises to the adjacent wiring lines through the capacitance between the wiring lines to cause potential fluctuations, increasing the possibility of causing an erroneous circuit operation. In other words, there is the problem that the cross-talk noise is increased. FIG. 4 shows a conceptual diagram of the above-mentioned circuit. In FIG. 4, a line capacitance C1 between a wire 101 and a wire 102 is conceptually illustrated by a capacitor 103, while an interlayer capacitance C2 between the wire 102 and a lower layer wire 105 located below the wire 102 is conceptually illustrated by a capacitor 104. It is to be noted that the lower layer wire 105 extends in a direction perpendicular to a direction in which the wire 102 extends. The potential fluctuation of the wire 102 due to the signal of the wire 101 is proportional to the equation:

$$\omega\left(\frac{1}{1+C2/C1}\right)$$

where $\omega$ is the frequency. That is, the cross-talk noise increases as the operating -speed increases, and the cross-talk noise decreases as the interlayer capacitance C2 is greater than the line capacitance C1.

SUMMARY OF THE INVENTION

Accordingly, the object of the present invention is to provide a semiconductor device that is able to prevent copper diffusion into a low dielectric constant insulating film and reduce the dielectric constant and water absorptivity of the low dielectric constant insulating film and has a reduced amount of cross-talk noises and a method for fabricating the device.

In order to achieve the above object, there is provided a semiconductor device having a semiconductor substrate, a wiring layer that is made principally of copper and is formed on the semiconductor substrate and a low dielectric constant insulating film that has a dielectric constant lower than that of a silicon oxide film and is formed around the wiring layer, the low dielectric constant insulating film containing phosphorus and hydrocarbon.

According to the semiconductor device of the present invention, by virtue of the phosphorus contained in the low dielectric constant insulating film, the phosphorus exerts the gettering effect on the copper atoms, and therefore, the copper atoms can be prevented from diffusing into the low dielectric constant insulating film. Furthermore, by virtue of the hydrocarbon contained in the low dielectric constant insulating film, the hydrocarbon removes the water molecules. The above arrangement can reduce the water absorptivity and the dielectric constant of the low dielectric constant insulating film, allowing the reduction of the cross-talk noises.

In one embodiment of the present invention, the low dielectric constant insulating film is comprised of a first silicon oxide film containing phosphorus and a second silicon oxide film that contains phosphorus and hydrocarbon and is formed on the first silicon oxide film.

In one embodiment of the present invention, a connection hole is formed through the first silicon oxide film, a wiring groove communicating with the connection hole is formed through the second silicon oxide film, the wiring layer is formed by covering the connection hole and the wiring groove with the material of the wiring layer, and a barrier film is formed between the connection hole and the wiring layer and between the wiring groove and the wiring layer.

In one embodiment of the present invention, the first silicon oxide film contains hydrocarbon.

In one embodiment of the present invention, the first silicon oxide film contains hydrocarbon.

In this case, the concentration of phosphorus in the second silicon oxide film is lower than the concentration of phosphorus in the first silicon oxide film, and the second silicon oxide film contains more hydrocarbon than the first silicon oxide film. With this arrangement, the dielectric constant of the second silicon oxide film corresponding to the insulating film between wiring lines becomes lower than the dielectric constant of the first silicon oxide film corresponding to the interlayer insulating film, allowing the cross-talk noises to be more surely reduced.

In one embodiment of the present invention, the hydrocarbon contains at least an alkyl group.

In this case, by virtue of the hydrocarbon that includes an alkyl group such as a methyl group, an ethyl group or the like and is contained in the low dielectric constant insulating film made principally of $SiO_2$, the density and polarizability of the low dielectric constant insulating film can be reduced.

Also, there is provided a method for fabricating the semiconductor device comprising:

a process for forming the low dielectric constant insulating film by plasma decomposition.

According to the semiconductor device fabricating method having the aforementioned construction, which includes the process for forming the low dielectric constant insulating film by plasma decomposition, the formation of a excellent low dielectric constant insulating film can be achieved. In this case, phosphine, nitrous oxide and tetramethylsilane should preferably be used as a material gas for plasma decomposition.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 3 is a schematic sectional view of the conventional semiconductor device.

DETAILED DESCRIPTION OF THE PREFERRED EMBODIMENTS

Figure 1A:
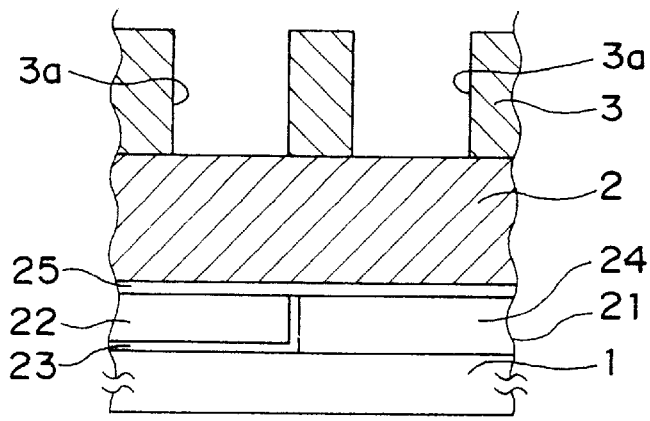
FIGS. 1A through 1D are process charts for fabricating a semiconductor device according to one embodiment of the present invention.

The semiconductor device and the fabricating method of the present invention will be described in detail below on the basis of the embodiments thereof shown in the drawings.

Figure 1B:
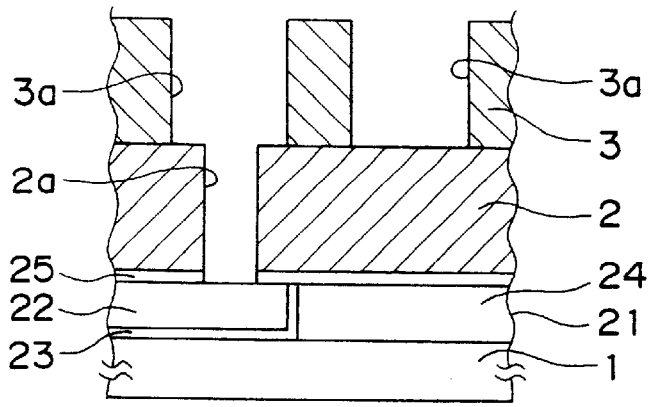
Figure 1C:
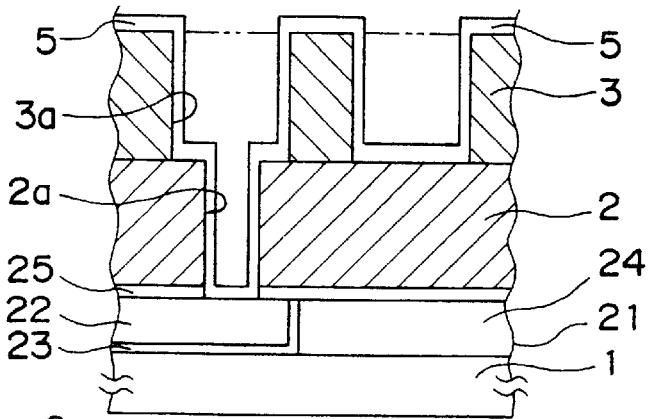
Figure 1D:
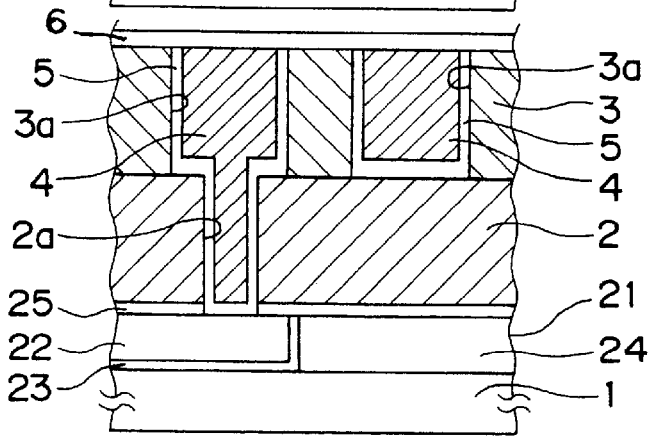
Figure 2A:
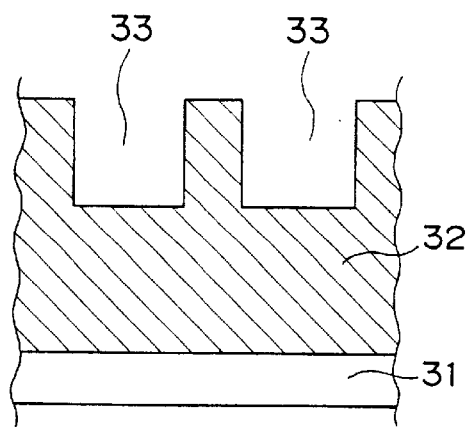
FIGS. 2A through 2E are process charts for fabricating a conventional semiconductor device.
Figure 2D:
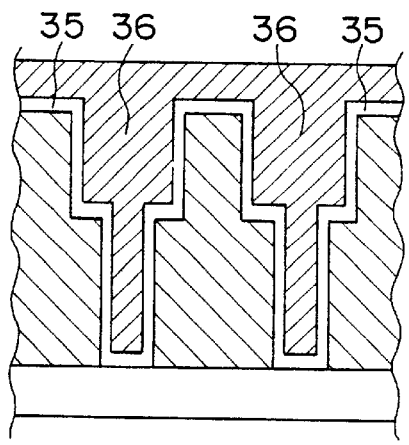
Figure 2B:
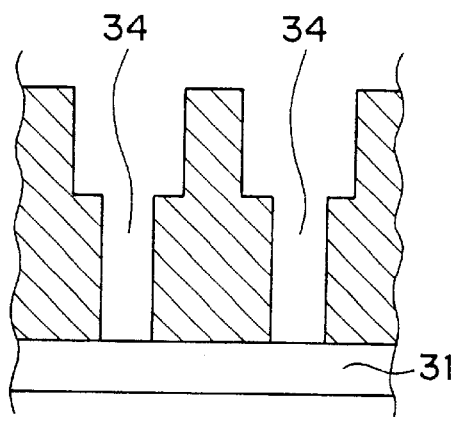
Figure 2E:
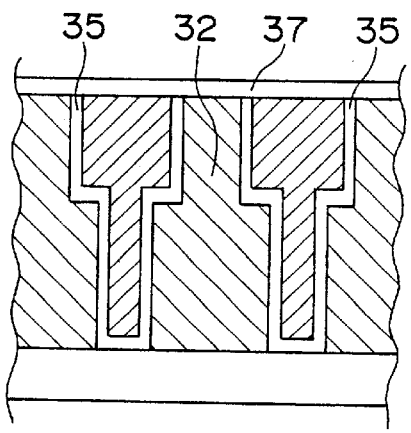
Figure 2C:
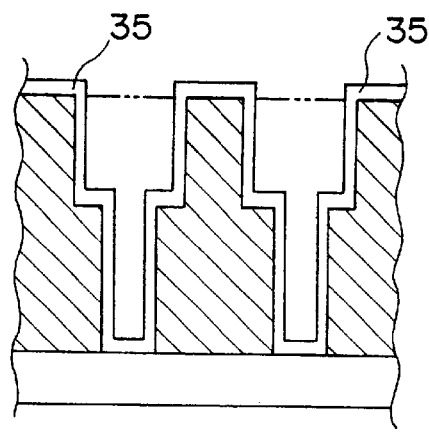
Figure 4:
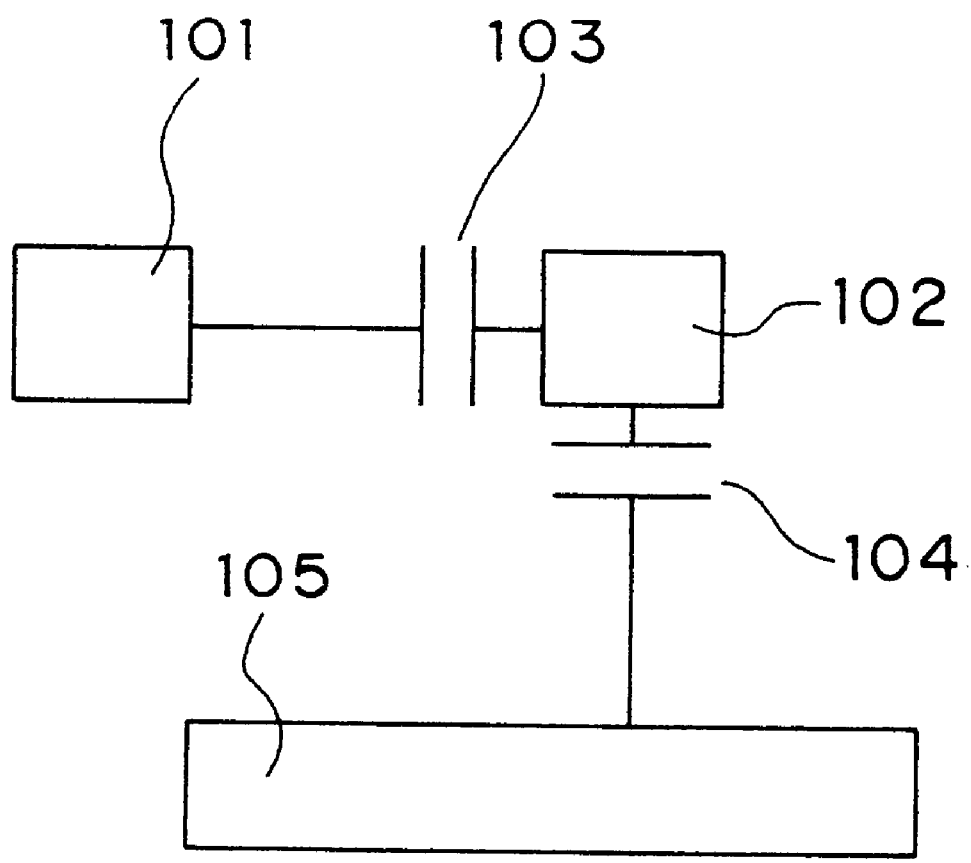
FIG. 4 is a conceptual diagram for explaining the cross-talk noise of the conventional semiconductor device.

FIGS. 1A through 1D are process charts for fabricating a semiconductor device according to one embodiment of the present invention. As shown in FIG. 1D, the semiconductor device includes a semiconductor substrate 1, an interlayer insulating film 2 that is formed on the semiconductor substrate 1 and serves as a first insulating film having a connection hole 2a, a line insulating film 3 that is formed on the interlayer insulating film 2 and serves as a second insulating film having a wiring groove 3a and a copper wiring film 4 that serves as a wiring layer for covering the connection hole 2a and the wiring groove 3a. A lower layer conductive portion 21 is formed between the semiconductor substrate 1 and the interlayer insulating film 2, while a metal barrier film 5 is formed between the copper wiring film 4 and the interlayer insulating film 2 and the line insulating film 3. The lower layer conductive portion 21 is constructed of a copper wiring layer 22, a metal barrier film 23, a lower layer insulating film 24 and an insulating barrier layer 25. The interlayer insulating film 2 and the line insulating film 3 constitute a low dielectric constant insulating film. It is to be noted that the reference numeral 6 denotes an insulating barrier layer located in the uppermost portion.

The interlayer insulating film 2 and the line insulating film 3 are made principally of $SiO_2$ and contain phosphorus and hydrocarbon. The line insulating film 3 contains more hydrocarbon than the interlayer insulating film 2 and is controlled by changing the film forming conditions so that, for example, the dielectric constant of the line insulating film 3 becomes 3.5 (or 2.6) with respect to the dielectric constant of 4.0 (or 3.0) of the interlayer insulating film 2. The dielectric constant of the line insulating film 3 should preferably be as small as possible, and it is possible to finely control the dielectric constant to about 2.2 to 2.3 by the method described later. However, the etching process becomes difficult if the dielectric constant is reduced. That is, the dielectric constant becomes small if a greater quantity of hydrocarbon is contained. However, if carbon is subsequently removed by oxygen plasma, then an oxide film is formed to hinder the progress of etching of the oxide film. At least, the line insulating film 3 should preferably have a dielectric constant of not smaller than 2.5, while the interlayer insulating film 2 should preferably have a dielectric constant of 3.0 to 4.2. Depending on the uses of LSI, whether it is intended for higher operating speed or putting emphasis on low consumption of power, or depending on wiring layout, the optimum dielectric constant and dielectric constant ratio between the interlayer insulating film 2 and the line insulating film 3 differ. In general, it is desired that the line insulating film 3 and the interlayer insulating film 2 differ from each other by a ratio of not smaller than 3:4.

According to the semiconductor device having the aforementioned construction, by virtue of the phosphorus contained in the interlayer insulating film 2 and the line insulating film 3, the phosphorus exerts the gettering effect on the copper atoms, and therefore, the copper atoms of the copper wiring film 4 can be prevented from diffusing into the interlayer insulating film 2 and the line insulating film 3. Furthermore, by virtue of the hydrocarbon contained in the interlayer insulating film 2 and the line insulating film 3, the hydrocarbon removes the water molecules. The above arrangement can reduce the water absorptivity of the interlayer insulating film 2 and the line insulating film 3 and the dielectric constant of the interlayer insulating film 2 and the line insulating film 3, allowing the reduction of the crosstalk noises.

The line insulating film 3 contains more hydrocarbon than the interlayer insulating film 2. Therefore, the dielectric constant of the line insulating film 3 becomes smaller than the dielectric constant of the interlayer insulating film 2, allowing the cross-talk noises to be more surely reduced.

The above-mentioned semiconductor device is fabricated as follows.

First, as shown in FIG. 1A, the lower layer conductive portion 21 is laminated on the semiconductor substrate 1, and thereafter, the interlayer insulating film 2 and the line insulating film 3 are successively laminated on the lower layer conductive portion 21.

The interlayer insulating film 2 and the line insulating film 3 are formed by the plasma CVD method. The material gases used for the plasma CVD method are, for example, phosphine ($PH_3$), tetramethylsilane ($Si(CH_3)_4$ referred to as TMS hereinafter) and nitrous oxide ($N_2O$).

Other film forming conditions include, for example, an $N_2O$ flow rate of 1000 sccm to 10000 sccm, a $PH_3$ flow rate of 100 sccm to 500 sccm, a TMS+silane total flow rate of 500 sccm to 1500 sccm, a pressure of 1.5 Torr to 5.0 Torr, an RF (Radio Frequency) power of 400 W to 1500 W and a substrate temperature of 300° C. to 500° C. More specifically, the interlayer insulating film 2 and the line insulating film 3 are formed as films under the conditions of, for example, an $N_2O$ flow rate of 8000 sccm, a $PH_3$ flow rate of 100 sccm, a TMS flow rate of 1000 sccm, a silane flow rate of 200 sccm, a pressure of 2.5 Torr, an RF power of 900 W and a substrate temperature of 400° C. In this case, there can be formed the interlayer insulating film 2 and the line insulating film 3, which have a hydrocarbon concentration of 30% and a phosphorus concentration of 1%, and their dielectric constant is around 3.0. In this case, with regard to the film forming condition of the interlayer insulating film 2, the TMS flow rate is set smaller than half to zero sccm with respect to the film forming condition of the line insulating film 3. If the TMS flow rate of the film forming condition of the interlayer insulating film 2 is set to zero sccm and the TMS flow rate of the film forming condition of the line insulating film 3 is set to 500 sccm, then the upper limit value of the dielectric constant of the interlayer insulating film 2 and the line insulating film 3 can be varied within a range of 4.2 to 3.5. The $PH_3$ flow rate should preferably be greater when forming the interlayer insulating film 2 than when forming the line insulating film 3. For example, when forming the interlayer insulating film 2, it is preferable to set the $PH_3$ flow rate to 250 sccm and set the phosphorus concentration of the interlayer insulating film 2 to about 3%. When forming the line insulating film 3, the phosphorus is not always required to be contained and $PH_3$ may be set to zero sccm when the metal barrier film 5 is deposited to a thickness of not smaller than 5 nm on the side walls of the wiring grooves 3a.

Then, the wiring grooves 3a are formed by etching in the desired positions of the line insulating film 3. In this stage, the line insulating film 3 is deposited to a thickness of, for example, 300 nm to 700 nm, and the interlayer insulating film 2 is deposited to a thickness of, for example, 400 nm to 800 nm.

Next, as shown in FIG. 1B, a connection hole 2a is formed by etching below the wiring groove 3a. This connection hole 2a reaches the copper wiring layer 22 of the lower layer conductive portion 21.

Next, as shown in FIG. 1C, the metal barrier film 5 is deposited to a thickness of 5 nm to 10 nm so as to cover the surfaces of the wiring groove 3a, the connection hole 2a and the line insulating film 3.

Next, as shown in FIG. 1D, a copper wiring film 4 is deposited to a thickness of about 1 μm by, for example, the CVD method and the plating method so as to cover the wiring grooves 3a and the connection hole 2a. Finally, the metal barrier film 5 and the copper wiring film 4 located above the two-dot chain line shown in FIG. 1C are removed by the CMP method to flatten the surfaces of the metal barrier film 5, the copper wiring film 4 and the line insulating film 3, and thereafter, an insulating barrier layer 6 is deposited to a thickness of 50 nm to 100 nm.

As described above, the interlayer insulating film 2 and the line insulating film 3 are formed by the plasma CVD method, and therefore, an interlayer insulating film 2 and a line insulating film 3 of high quality can be formed.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device comprising:
    a semiconductor substrate,
    a wiring layer comprising copper and being supported by the semiconductor substrate,
    an insulating film comprising at least a first insulating layer, said first insulating layer of the insulating film having a dielectric constant lower than that of a silicon oxide film and being formed at least partially around the wiring layer,
    wherein said first insulating layer of the insulating film comprises each of phosphorus and hydrocarbon.

2. A semiconductor device as claimed in claim 1, wherein the insulating film comprises (a) said first insulating layer which comprises silicon oxide along with said phosphorus and hydrocarbon, and (b) a second insulating layer comprising silicon oxide, phosphorus and hydrocarbon which is formed over said first insulating layer.

3. A semiconductor device as claimed in claim 2, wherein
    a connection hole is formed through said first insulating layer, a wiring groove communicating with the connection hole is formed through the second insulating layer,
    the wiring layer is formed by covering the connection hole and the wiring groove with the material of the wiring layer, and
    a barrier film is formed between the connection hole and the wiring layer and between the wiring groove and the wiring layer.

4. A semiconductor device as claimed in claim 1, wherein said first insulating layer has a dielectric constant from 3.0 to 4.2.

5. A semiconductor device as claimed in claim 1, wherein said first insulating layer has a dielectric constant of not smaller than 2.5.

6. A semiconductor device as claimed in claim 2, wherein phosphorus concentration in the second insulating layer is lower than phosphorus concentration in said first insulating layer, and hydrocarbon concentration in the second insulating layer is higher than hydrocarbon concentration in said first insulating layer.

7. A semiconductor device as claimed in claim 1, wherein the hydrocarbon contains at least an alkyl group.

8. A method for fabricating the semiconductor device claimed in claim 1, comprising: a process for forming the insulating film by plasma deposition.

9. A semiconductor device comprising:
    a substrate;
    a conductive wiring layer supported by the substrate;
    an insulating film comprising at least a first layer located between the substrate and at least part of the conductive wiring layer; and
    wherein said first layer of the insulating film comprises each of phosphorus and at least one hydrocarbon.

10. The semiconductor device of claim 9, wherein said insulating film further comprises a second layer in contact with the first layer, wherein the second layer of the insulating film comprises a hydrocarbon.

11. The semiconductor device of claim 10, wherein each of the first and second layers of the insulating film comprise silicon oxide.

12. The semiconductor device of claim 10, wherein the second layer further comprises phosphorus.

13. The semiconductor device of claim 9, wherein the conductive wiring layer comprises copper and is formed at least partially in at least one groove formed in at least one of the first and second layers of the insulating film.

14. The semiconductor device of claim 9, wherein the first layer of the insulating film has a dielectric constant of from 3.0 to 4.2.

15. The semiconductor device of claim 9, wherein the first layer of the insulating film has a dielectric constant of not smaller than 2.5.

16. The semiconductor device of claim 10, wherein each of the first and second layers of the insulating film comprise both phosphorus and at least one hydrocarbon, and wherein an upper of said first and second layers includes more hydrocarbon(s) than a lower of the first and second layers of the insulating film.

* * * * *